US009671436B2

(12) United States Patent
Tsukamoto et al.

(10) Patent No.: US 9,671,436 B2
(45) Date of Patent: Jun. 6, 2017

(54) ELECTRIC CURRENT SENSOR HAVING MAGNETIC CORE

(71) Applicant: DENSO CORPORATION, Kariya, Aichi-pref. (JP)

(72) Inventors: Takeshi Tsukamoto, Okazaki (JP); Tatsuya Takagi, Kariya (JP); Teruo Oda, Gamagori (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/765,003

(22) PCT Filed: Mar. 10, 2014

(86) PCT No.: PCT/JP2014/001346
§ 371 (c)(1),
(2) Date: Jul. 31, 2015

(87) PCT Pub. No.: WO2014/141680
PCT Pub. Date: Sep. 18, 2014

(65) Prior Publication Data
US 2015/0377932 A1    Dec. 31, 2015

(30) Foreign Application Priority Data

Mar. 11, 2013 (JP) .................................. 2013-48066
Mar. 4, 2014 (JP) .................................. 2014-41211

(51) Int. Cl.
*G01R 19/00* (2006.01)
*G01R 15/20* (2006.01)

(52) U.S. Cl.
CPC ....... *G01R 19/0092* (2013.01); *G01R 15/202* (2013.01)

(58) Field of Classification Search
CPC ........ G01R 15/18; G01R 15/202; G01R 1/04; G01R 1/06788; G01R 19/00;
(Continued)

(56) References Cited

U.S. PATENT DOCUMENTS 6,388,549 B1    5/2002    Lenhard
6,759,840 B2 *  7/2004    Marasch .............. G01R 15/247
                                        324/117 H (Continued)

FOREIGN PATENT DOCUMENTS

JP    2003-215169 A    7/2003
JP    2008-233013 A    10/2008
(Continued)

OTHER PUBLICATIONS

Office Action mailed Nov. 17, 2015 in the corresponding JP application No. 2014-041211 (with English translation).
(Continued)

*Primary Examiner* — Vinh Nguyen
(74) *Attorney, Agent, or Firm* — Posz Law Group, PLC

(57) ABSTRACT

An electric current sensor includes a core having a coupling portion formed by bending a part of a plate member, and one end portion and the other end portion of the plate member are disposed to oppose to each other through a constant magnetic gap on a side opposite from the coupling portion. The core has: a first tapered portion in which a width of the plate member continuously decreases from one end of the coupling portion adjacent to the one end portion to a distal end of the one end portion; and a second tapered portion in which the width of the plate member continuously decreases from an other end of the coupling portion adjacent to the other end portion to a distal end of the other end portion.

15 Claims, 10 Drawing Sheets

(58) Field of Classification Search
CPC .............. G01R 15/185; G01R 15/186; G01R 19/0092; G01R 19/15; G01R 19/145; G01R 21/00; G01R 15/142; G01R 11/067; G01R 15/08; G01R 15/146; G01R 15/181; G01R 15/183; G01R 19/16509; G01R 19/20; G01R 19/28; G01R 21/133; G01R 33/0011; G01R 33/09

See application file for complete search history.

(56) References Cited

U.S. PATENT DOCUMENTS

| 7,148,675 B2* | 12/2006 | Itoh | G01R 15/202 |
| | | | 324/117 H |
| 2001/0052765 A1 | 12/2001 | Seike | |
| 2005/0237049 A1 | 10/2005 | Ozaki et al. | |
| 2005/0237050 A1 | 10/2005 | Itoh | |
| 2007/0164727 A1 | 7/2007 | Racz et al. | |

FOREIGN PATENT DOCUMENTS

| JP | 2012-002689 A | 1/2012 |
| JP | 2014-174042 A | 9/2014 |
| JP | 2014-202623 A | 10/2014 |
| JP | 2014-202624 A | 10/2014 |
| WO | 2011/158633 A1 | 12/2011 |

OTHER PUBLICATIONS

Office Action mailed, Aug. 25, 2015 in the corresponding JP application No. 2014-41211 (with English Translation).
International Search Report of the International Searching Authority dated Jun. 10, 2014 issued in the corresponding International application No. PCT/JP2014/001346 (and English translation).
Written Opinion of the International Searching Authority dated Jun. 10, 2014 issued in the corresponding International application No. PCT/JP2014/001346 (and English translation).

* cited by examiner (a)

(b)

(c)

ELECTRIC CURRENT SENSOR HAVING MAGNETIC CORE

CROSS REFERENCE TO RELATED APPLICATIONS

This application is a U.S. national phase of International Patent Application No. PCT/JP2014/001346 filed on Mar. 10, 2014 and is based on Japanese Patent Application No. 2013-48066 filed on Mar. 11, 2013 and Japanese Patent Application No. 2014-41211 filed on Mar. 4, 2014, the disclosures of which are incorporated herein by reference.

TECHNICAL FIELD

The present disclosure relates to an electric current sensor configured to detect a magnitude of current based on a magnitude of magnetic flux generated in a core.

BACKGROUND ART

To date, a current sensor core formed by bending a plate member made of a magnetic body has been proposed in, for example, PTL 1. Specifically, PTL 1 proposes a core including a core main body configured of a bent plate member, and a gap portion in which two end portions of the bent plate member are disposed opposing across a predetermined gap.

The core main body has an inclined portion inclined in which the dimension in the short dimension direction of the plate member, that is, the width dimension of the plate member, decreases from the side opposite from the gap portion to a connection between the gap portion and the core main body. Meanwhile, the width dimension of the plate member is constant in the gap portion.

PRIOR ART LITERATURES

Patent Literature

PTL 1: JP 2008-233013 A

SUMMARY OF INVENTION

However, a magnetic field concentrates at a connection corner between the inclined portion and the gap portion, because no inclined portion is provided in the gap portion, while the inclined portion in which the width dimension of the plate member decreases is provided in the core main body. Therefore, magnetic resistance at the connection between the core main body and the gap portion becomes uneven, and desired current detecting characteristics are not obtained by the current sensor.

The present disclosure is aimed to provide an electric current sensor including a core that has uniform magnetic resistance characteristics.

According to an aspect of the present disclosure, an electric current sensor includes a core having a coupling portion formed by bending a part of a plate member, and one end portion and the other end portion of the plate member are disposed to oppose to each other through a constant magnetic gap on a side opposite from the coupling portion.

When a current to be measured flows to pass through a hollow portion of the core, the electric current sensor detects a magnitude of the current based on a magnitude of a magnetic flux generated in the core.

The core has a first tapered portion in which a width of the plate member continuously decreases from one end of the coupling portion adjacent to the one end portion to a distal end of the one end portion, and a second tapered portion in which the width of the plate member continuously decreases from the other end of the coupling portion adjacent to the other end portion to a distal end of the other end portion.

As the first tapered portion and the second tapered portion are provided in the core in this way, there is no place in which a magnetic field concentrates due to the shape of the core from the coupling portion to each distal end. Consequently, uniform magnetic resistance characteristics can be obtained in the core.

DESCRIPTION OF EMBODIMENTS

Figure 1:
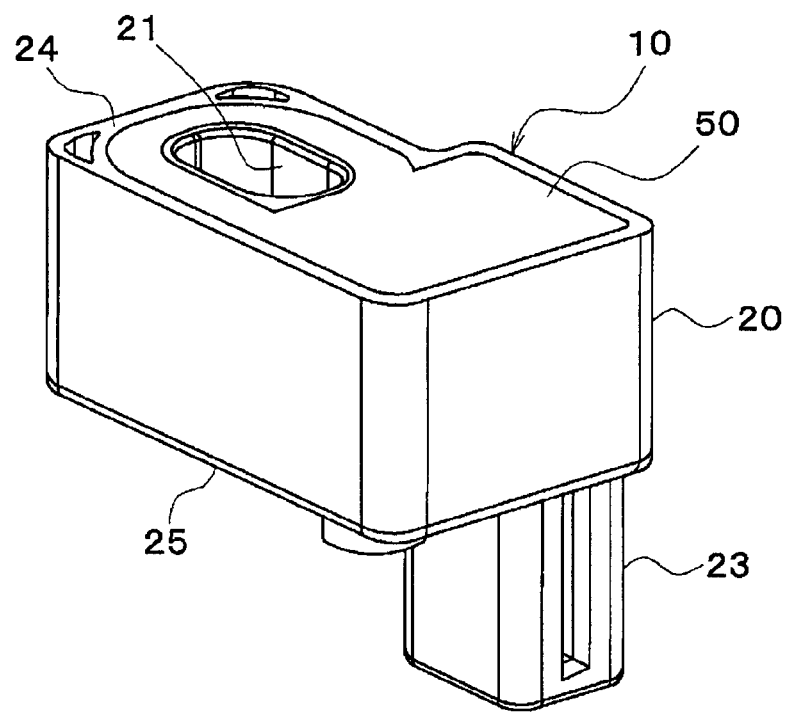
FIG. 1 is a perspective view of a current sensor according to a first embodiment.

Hereafter, embodiments will be described based on the drawings. In each of the following embodiments, portions that are the same as, or equivalent to, each other are given the same reference signs in the drawings.

First Embodiment

Figure 2:
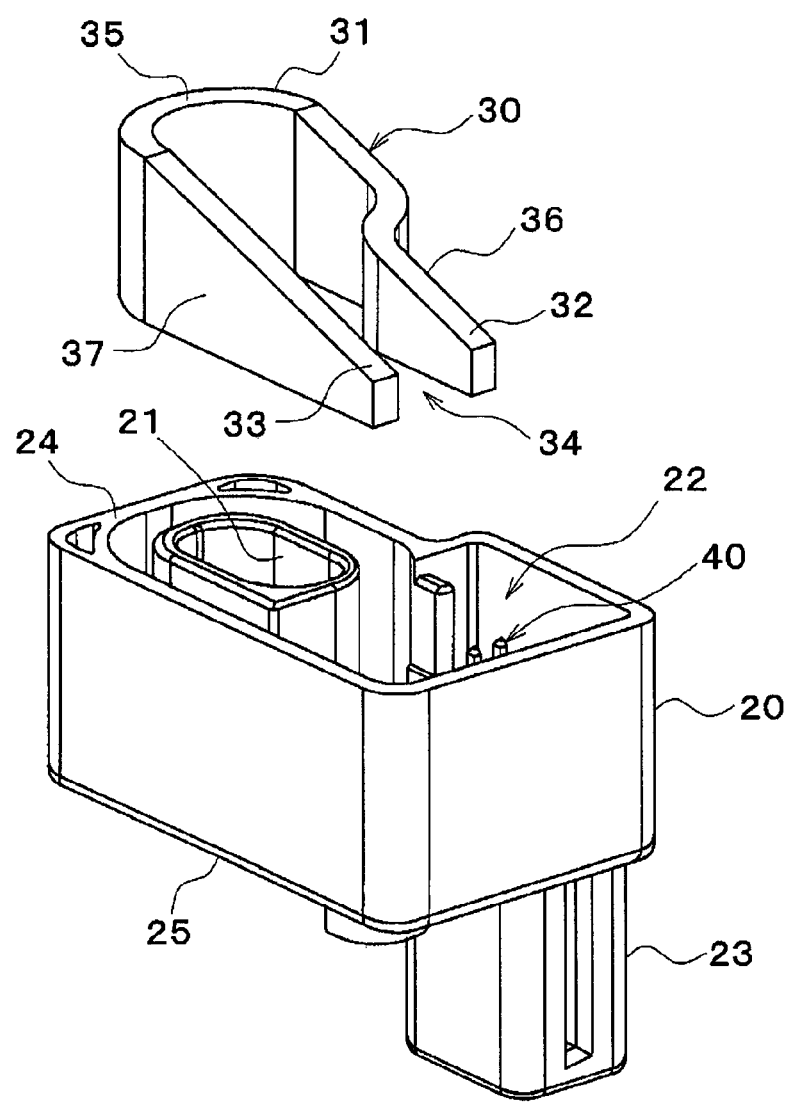
FIG. 2 is an exploded view illustrating a case and a core of FIG. 1.

A first embodiment will be described, referring to the drawings. As shown in FIG. 1 and FIG. 2, a current sensor 10 is configured to include a case 20, a core 30, a circuit portion 40, and a filling material 50.

The case 20 forms the external aspect of the current sensor 10, and is made of a molded resin material. In this embodiment, the case 20 has a quadrangular prism shape. The case 20 has a through hole 21, a housing portion 22, and a connector portion 23.

The through hole 21 is provided to penetrate one surface 24 of the case 20 and an other surface 25 of the case 20 opposite from the one surface 24. Current to be measured flows to pass through the through hole 21 via wiring or the like.

The housing portion 22 is a space excluding the through hole 21. The housing portion 22 is formed by making a part of the one surface 24 of the case 20 to be recessed toward the other surface 25. That is, the housing portion 22 is provided around the periphery of the through hole 21. The core 30 and the circuit portion 40 are housed in the housing portion 22.

The connector portion 23 is a connection portion for electrically connecting the circuit portion 40 and the exterior. The connector portion 23 is provided to protrude from the other surface 25 of the case 20, and a connector of a cable connected to a non-illustrated current detector device is connected to the connector portion 23.

A magnetic flux is generated in the core 30 when current to be measured flows to pass through the hollow portion of the core 30. The core 30 is configured of one-piece plate member 31, and one end portion 32 of the plate member 31 and an other end portion 33 of the plate member 31 are disposed to oppose to each other across a constant magnetic gap 34. A magnetic material such as permalloy is used as the core 30.

When the core 30 is housed in the housing portion 22 of the case 20, the through hole 21 of the case 20 is positioned in the hollow portion of the core 30. Also, the current to be measured passes through the through hole 21. Consequently, the measurement target current passes through the hollow portion of the core 30.

The circuit portion 40 has a non-illustrated Hall IC for detecting the magnitude of a magnetic flux generated in the core 30, a non-illustrated circuit chip for processing a signal from the Hall IC, and the like. The Hall IC is disposed in the magnetic gap 34 of the core 30.

The filling material 50 is a sealing member with which the housing portion 22 is filled in a state where the core 30 and the circuit portion 40 are housed in the housing portion 22 of the case 20. A material such as urethane is used as the filling material 50. The surface of the filling material 50 with which the housing portion 22 is filled forms a part of the one surface 24 of the case 20. The above is the whole configuration of the current sensor 10 according to this embodiment.

Figure 3:
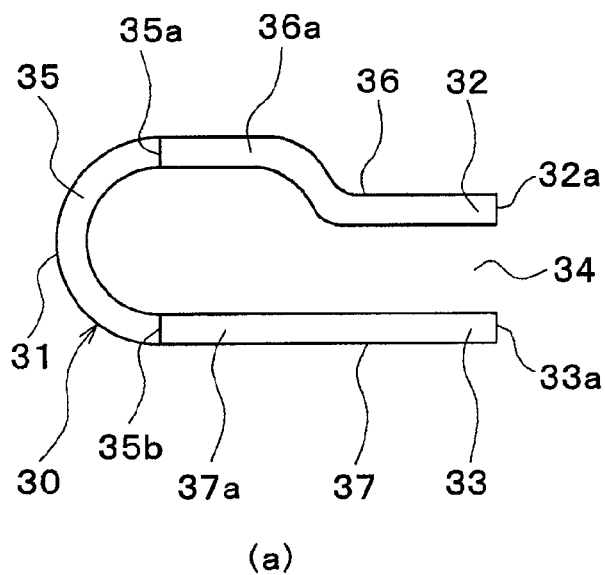
FIG. 3 (a) is a plan view of the core on each tapered portion side, FIG. 3 (b) is a lateral view of the core, and FIG. 3 (c) is a front view of the core on a magnetic gap side.
Figure 3:
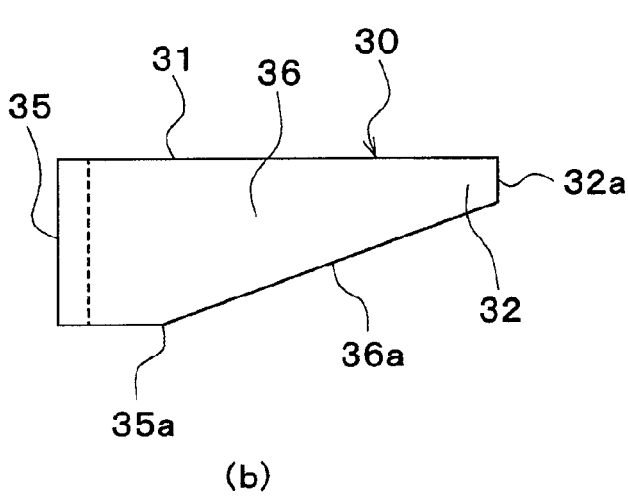
Figure 3:
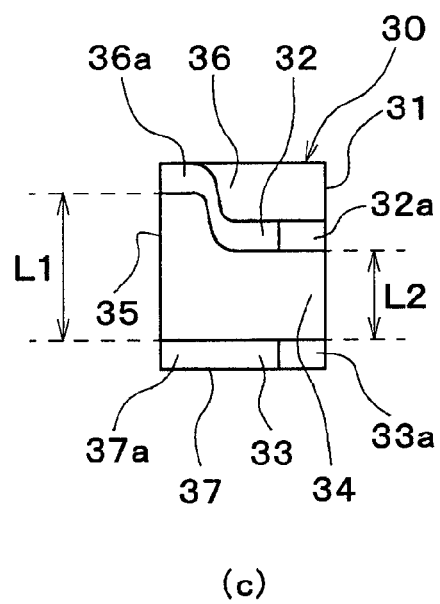

The core 30 of the current sensor 10 will be described in details. As shown in FIG. 3, the core 30 is configured of a bent portion 35 at which a part of the plate member 31 is bent, and a first plate portion 36 and a second plate portion 37, each of which is a part of the plate member 31 and is connected to the bent portion 35. That is, when the core 30 is developed, the plate member 31 is configured as a member in which the bent portion 35 is interposed between the first plate portion 36 and the second plate portion 37.

The one end portion 32 of the plate member 31 corresponds to an end portion of the first plate portion 36 on the side opposite to the bent portion 35. Also, the other end portion 33 of the plate member 31 corresponds to an end portion of the second plate portion 37 on the side opposite to the bent portion 35.

As shown in FIG. 3 (a), the bent portion 35 is bent with a constant diameter so as to have a half cylinder form. Herein, "half" is assumed to be a perfect circle divided into two. Consequently, a "half cylinder form" indicates a state in which a cylinder is divided into two along the central axis so as to pass through the central axis of the cylinder. With this configuration, the path of a magnetic flux generated in the bent portion 35 forms an arc shape with a constant diameter, and magnetic resistance in the bent portion 35 can be reduced.

The core 30 has a first tapered portion 36a in the first plate portion 36, and has a second tapered portion 37a in the second plate portion 37. Specifically, as shown in FIG. 3 (b), the first tapered portion 36a is formed so that the width of the first plate portion 36 of the plate member 31 continuously decreases from an end 35a of the bent portion 35 adjacent to the one end portion 32 to a distal end 32a of the one end portion 32.

The end 35a of the bent portion 35 adjacent to the one end portion 32 indicates one end of the bent portion 35 having the half cylinder form in the circumferential direction. The end 35a of the bent portion 35 indicates a part of the bent portion 35 connected to the first plate portion 36, and corresponds to a starting point of the first tapered portion 36a. The end point of the first tapered portion 36a corresponds to the distal end 32a of the one end portion 32 of the first plate portion 36.

The second tapered portion 37a is formed so that the width of the second plate portion 37 of the plate member 31 continuously decreases from an end 35b of the bent portion 35 adjacent to the other end portion 33 to a distal end 33a of the other end portion 33. Herein, the end 35b of the bent portion 35 adjacent to the other end portion 33 indicates an other end of the bent portion 35 having the half cylinder form in the circumferential direction. That is, the end 35b of the bent portion 35 corresponds to a starting point of the second tapered portion 37a, while the distal end 33a of the other end portion 33 of the second plate portion 37 corresponds to the end point of the second tapered portion 37a.

The width of the first plate portion 36 refers not to the thickness of the plate member 31 configuring the first plate portion 36, but to the width dimension of the first plate portion 36 in the short dimension direction of the plate member 31. In the same way, the width of the second plate portion 37 refers to the width dimension of the second plate portion 37 in the short dimension direction of the plate member 31.

A side surface of the bent portion 35 on the side opposite to the first tapered portion 36a and the second tapered portion 37a, a side surface of the first plate portion 36 on the side opposite to the first tapered portion 36a, and a side surface of the second plate portion 37 on the side opposite to the second tapered portion 37a are positioned in the same plane.

As shown in FIG. 3 (c), an intermediate portion of the first plate portion 36 is bent so that the one end portion 32 of the first plate portion 36 forms the magnetic gap 34 with the other end portion 33 of the second plate portion 37. With this configuration, the distance between an inner wall surface of the bent portion 35 at the end 35a adjacent to the one end portion 32 and an inner wall surface of the bent portion 35 at the end 35b adjacent to the other end portion 33 is greater than the magnetic gap 34 in the core 30. That is, when defining the distance between the plate portions 36 and 37 that are connected to the bent portion 35, that is, the inner diameter (diameter) of the bent portion 35, as L1 and when defining the magnetic gap 34 as L2, the core 30 is configured so as to satisfy the condition of L1>L2. As the diameter of the bent portion 35 increases in the core 30 that satisfies this condition, the magnetic resistance can be reduced.

The first plate portion 36 is connected to the end 35a of the bent portion 35 adjacent to the one end portion 32 in the tangential direction of the end 35a of the bent portion 35 adjacent to the one end portion 32. In the same way, the second plate portion 37 is connected to the end 35b of the bent portion 35 adjacent to the other end portion 33 in the tangential direction of the end 35b of the bent portion 35 adjacent to the other end portion 33. With this configuration, magnetic flux caught by the bent portion 35 can be efficiently led to the first plate portion 36 and the second plate portion 37.

The first tapered portion 36a and the second tapered portion 37a are formed in the core 30 by press-working the one plate member 31, and the bent part is formed by a bending press being carried out on the plate member 31. As the core 30 can be configured simply by only cutting out a part of the plate member 31 in order to provide each of the tapered portions 36a and 37a, the magnetic material can be used efficiently, and the magnetic material can be utilized without waste. Also, as the core 30 can be configured of one plate member 31, a small, light, and low-priced core 30 can be realized.

Next, a current detecting method of the current sensor 10 will be described. When current flows in a state where wiring or the like has been passed through the through hole 21 of the current sensor 10, a magnetic flux is generated in the core 30 in accordance with the magnitude of the current. Also, the magnetic flux leaks into the magnetic gap 34.

As the non-steep tapered portions 36a and 37a are provided in the core 30, the sectional area ratio between the magnetic path and the magnetic gap 34 is large. With this configuration, hysteresis (remaining magnetic flux) can be reduced, whereby the occurrence of magnetic saturation can be restricted.

The magnetic flux leaking into the magnetic gap 34 is detected by the Hall IC. A signal in accordance with the magnitude of the magnetic flux detected by the Hall IC is processed in the circuit portion 40. In this way, the magnitude of the current is detected. A signal in accordance with the magnitude of the current detected in the current sensor 10 is output to the exterior via the connector portion 23.

Advantages obtained by the shape of the core 30 according to this embodiment will be described. Firstly, the concept in the shape of the core 30 shown in FIG. 3 arrived by the inventors will be described.

Conventionally, a core is formed by integrally stacking multiple thin plates. Such a stacked core is configured by press-working multiple stacked thin plate-form magnetic bodies to have a ring shape. However, as a result of the inventors investigating the density distribution of magnetic flux generated inside the stacked core, it is found that there are many unnecessary portions in the stacked core.

Figure 4:
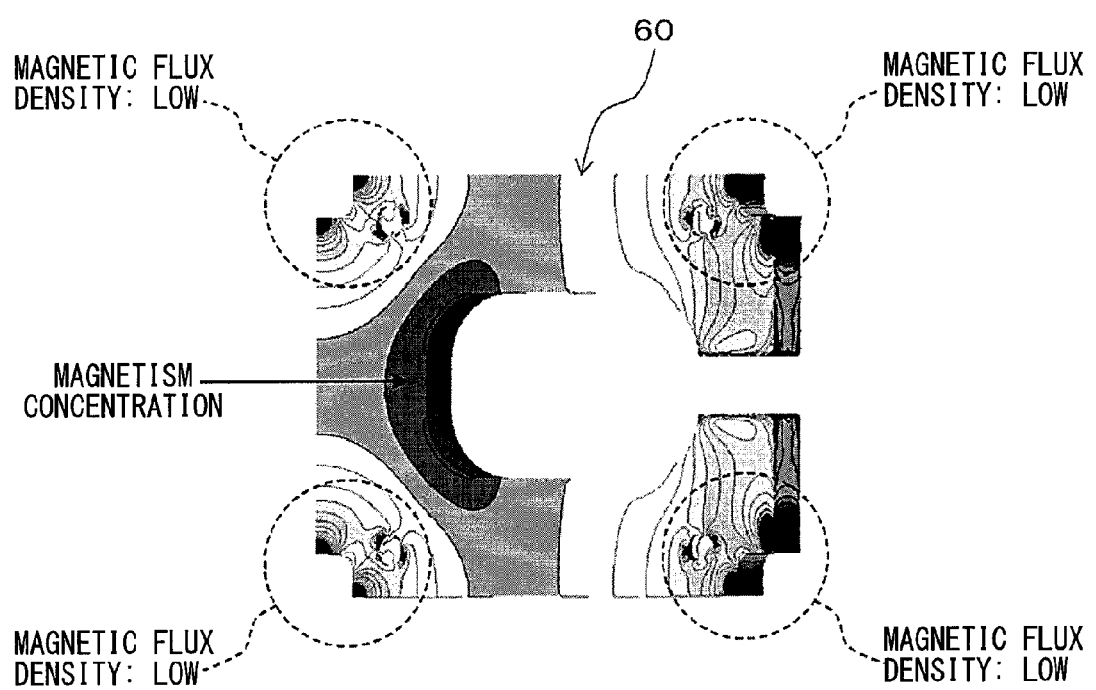
FIG. 4 is a perspective view showing density distribution of magnetic flux generated in a stacked core (comparison example).

Specifically, as shown as a comparison example in FIG. 4, it is found that magnetic flux hardly flows on the outer side of the stacked core 60, and that magnetic flux is concentrated on the inner side of the stacked core 60 where the magnetic path is short. Therefore, the inventors think that the stacked core 60 can be reduced in size and reduced in weight by using only a portion on the inner side of the stacked core 60 where the magnetic flux concentrates. Also, the inventors think that it is sufficient that the core 30 is formed by bending one plate member 31 rather than stacking a multiple of core fragments.

When magnetic flux density is defined as B, when magnetic resistance is defined as Rm, when measurement target current is defined as I, and when the sectional area of the stacked core 60 is defined as S, the magnetic flux density B of the stacked core 60 is expressed as $B=(I/Rm)\times(1/S)$. That is, the magnetic flux density B increases when the sectional area S is reduced. However, while it is preferable in terms of magnetic circuit design to increase the sectional area of the magnetic path, it is necessary to reduce the sectional area of the portion of the core 30 configuring the magnetic gap 34 in order to cause magnetic flux density to concentrate in the magnetic gap 34. Therefore, as shown in FIG. 3, the inventors propose the core 30 in which the widths of the first plate portion 36 and the second plate portion 37 continuously decrease from the bent portion 35.

Next, advantages will be described, which are obtained by making the widths of the first plate portion 36 and the second plate portion 37 of the core 30 to continuously decrease, that is, the widths of the first plate portion 36 and the second plate portion 37 are not constant in portions configuring the magnetic gap 34.

The inventors investigate the magnetic flux density distribution of a core 70, as a comparison example in which the widths of portions configuring the magnetic gap 34 are constant, and the magnetic flux density distribution of the core 30 according to this embodiment shown in FIG. 3. Results of the comparison example are shown in FIG. 5, while results of this embodiment are shown in FIG. 6.

Figure 5:
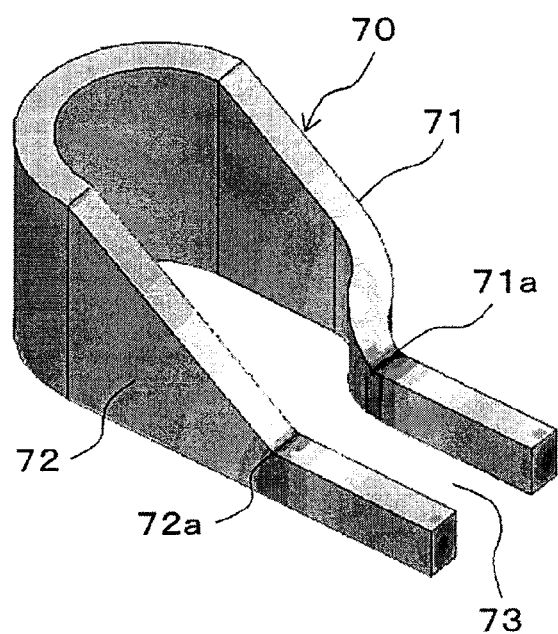
FIG. 5 is a diagram showing magnetic flux density distribution in a core (comparison example) having a portion in which a width continuously decreases and a portion in which the width is constant in a first plate portion and a second plate portion.

As shown in FIG. 5, each of a third plate portion 71 and a fourth plate portion 72 of the core 70 has a first portion where the width continuously decreases and a second portion where the width is constant. In this case, magnetic flux density concentrates at a neck portion 71a, 72a where the first portion is connected to the second portion, because magnetic resistance changes unevenly at the neck portion 71a, 72a. That is, the magnetic resistance is changed sharply by the shape of the neck portion 71a, 72a being angular rather than changing gently. A magnetic gap 73 is formed by the second portions of the third plate portion 71 and the fourth plate portion 72 where the width is constant.

Figure 6:
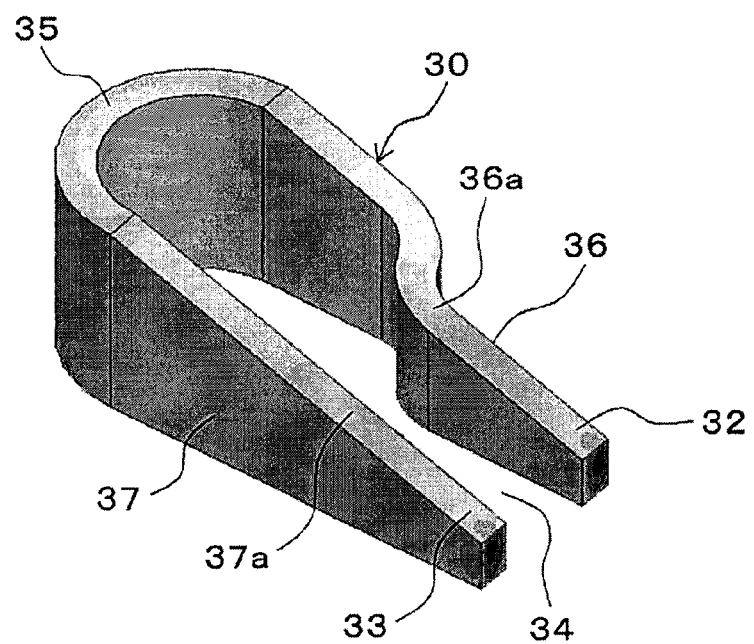
FIG. 6 is a diagram showing magnetic flux density distribution in the core of the first embodiment shown in FIG. 3.

In contrast, according to the present embodiment, as shown in FIG. 6, the widths of the first plate portion 36 and the second plate portion 37 of the core 30 continuously decrease regardless of the position of the magnetic gap 34. Therefore, the first plate portion 36 and the second plate portion 37 have no place where magnetic flux density concentrates. That is, in this embodiment, the first plate portion 36 and the second plate portion 37 of the core 30 have no inflection portion causing magnetic flux density to concentrate. Thus, magnetic resistance can be caused to change evenly in the first plate portion 36 and the second plate portion 37.

The third plate portion 71 and the fourth plate portion 72 may have inflection portion, other than the neck portions 71a and 72a, bent at right angles, or the like. It can be said that the inflection portion is a portion where magnetic resistance changes sharply.

In this embodiment, an intermediate portion of the first plate portion 36 is bent in order to adjust the length of the magnetic gap 34. This bent portion has a round shape but not with a right angle, and the plate surface is curved. With this configuration, the magnetic resistance does not change unevenly in the intermediate portion of the first plate portion 36. Consequently, a concentration of magnetic flux density can be avoided.

As the widths of the first plate portion 36 and the second plate portion 37 of the core 30 continuously decrease, the sectional areas of the portions of the first plate portion 36 and the second plate portion 37 configuring the magnetic gap 34 can be reduced. Thus, the magnetic flux density can be concentrated. Consequently, in the core 30 according to this embodiment, a sharp increase in magnetic resistance can be prevented, and a magnetic circuit that efficiently leads magnetic flux to the magnetic gap 34 can be configured.

The inventors investigate linearity with respect to measured current in each of the cores 30 and 70. "Linearity" refers to the rate of change in the gradient of magnetic flux density with respect to current value. For example, when the linearity is 0%, there is no change in the gradient of magnetic flux density with respect to current value. That is, current value and magnetic flux density are proportional. Meanwhile, when the linearity has a negative value, the gradient of magnetic flux density with respect to current value becomes small. In this case, even when the current value increases, the magnetic flux density tends to saturate.

Figure 7:
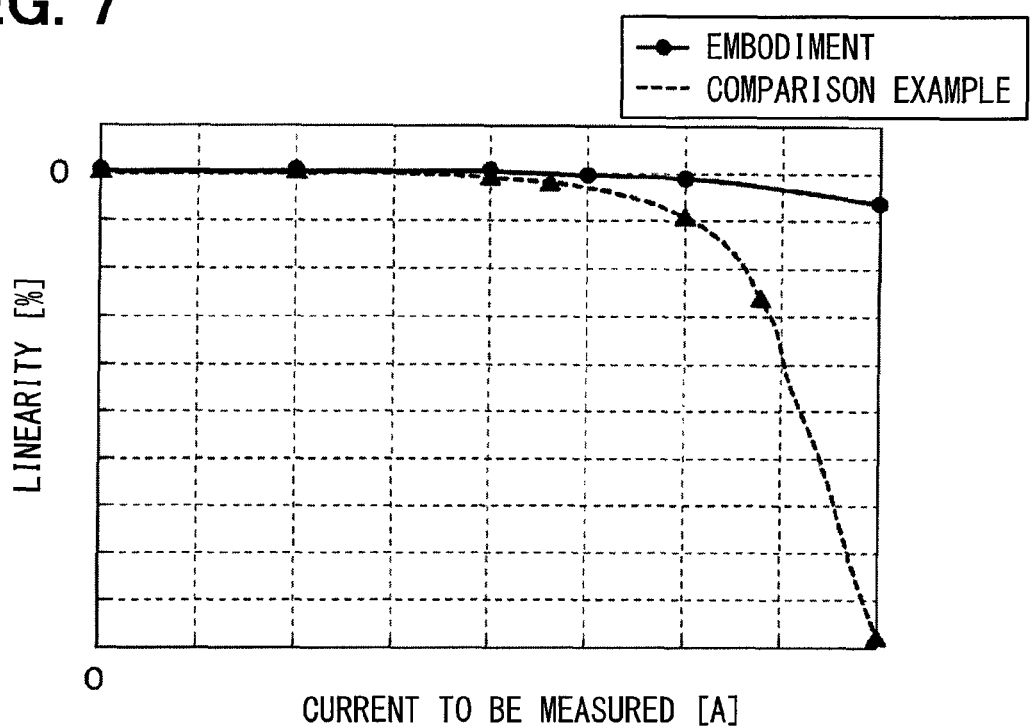
FIG. 7 is a diagram showing a relationship between a measured current and a linearity.

As shown in FIG. 7, the linearity decreases in accordance with an increase in the value of the measured current in the core 70 of the comparison example shown in FIG. 5. It can be thought that the linearity deteriorates because a sudden magnetic saturation occurs due to the neck portions 71a and 72a of the core 70. In contrast, according to this embodiment, when the value of the measured current increases, the decrease in the linearity is small in the core 30 shown in FIG. 6. That is, as the core 30 according to this embodiment does not have the neck portion 71a, 72a acting as the inflection portions, no sudden magnetic saturation occurs when the current value increases. Consequently, a decrease in the linearity with respect to the measured current can be restricted in the core 30 according to this embodiment.

The inventors investigate the S/N ratio of measured current with respect to the length of the magnetic gap 34, 73 in the core 30, 70. In the case of the core 70, which is the comparison example of FIG. 5, the length of the magnetic gap 73 corresponds to the length from the distal end of portion of the third plate portion 71 and the fourth plate portion 72 in which the width is constant toward the bent portion. In the case of the core 30 according to this embodiment in FIG. 6, the length of the magnetic gap 34 corresponds to the length from the distal end 32a, 33a of the first plate portion 36 and the second plate portion 37 toward the bent portion 35.

Figure 8:
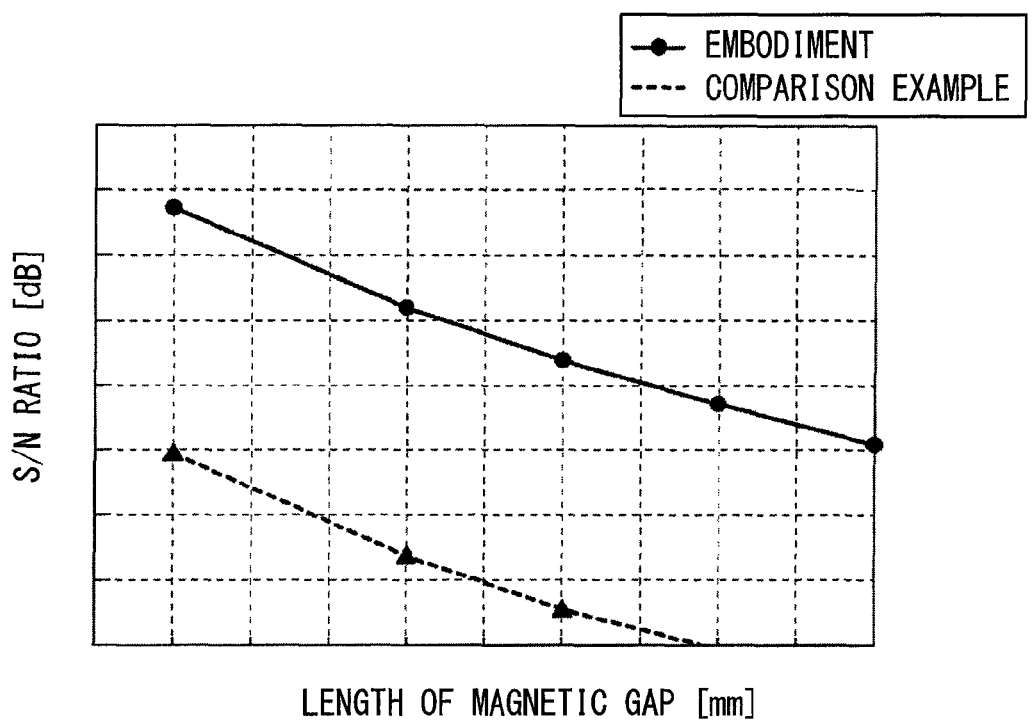
FIG. 8 is a diagram showing a relationship between a length of a magnetic gap and an S/N ratio.

As shown in FIG. 8, the S/N ratio of measured current increases as the magnetic gap 34, 73 becomes shorter in the core 30, 70. However, the S/N ratio of the core 30 according to this embodiment is higher overall than the S/N ratio of the core 70 of the comparison example shown in FIG. 5. This is because, while there are no neck portions 71a and 72a acting as the inflection portions in the core 30 according to this embodiment, the neck portions 71a and 72a acting as the inflection portions are provided in the core 70 shown in FIG. 5. That is, the area of the plate member 31 increases in the core 30 according to this embodiment, compared with the core 70 shown in FIG. 5, by an amount equivalent to the neck portions 71a and 72a. Therefore, according to the embodiment, noise from the exterior can be blocked out, and the shielding effect can be increased.

According to the present embodiment, the first tapered portion 36a and the second tapered portion 37a are provided in the core 30. With this configuration, magnetic field concentration caused by the form of the core 30 can be eliminated in the area from the bent portion 35 to the distal ends 32a, 33a. In other words, the plate portion 36, 37 of the core 30 has no place in which the magnetic field concentrates. Consequently, uniform magnetic resistance characteristics can be obtained in the core 30.

In the core 30 according to this embodiment, an intermediate portion of the first plate portion 36 is bent, but the second plate portion 37 is not bent. With this configuration, when the plate member 31 is bent, the bent portion 35 and the intermediate portion of the first plate portion 36 can be formed with the second plate portion 37 as a reference. That is, as the second plate portion 37 works a reference for the processing, the accuracy of processing the bent portion 35 and the intermediate portion of the first plate portion 36 can be increased. With this configuration, it can be ensured that the dimensional tolerance of the magnetic gap 34 is not exceeded in the processing.

Furthermore, as an intermediate portion of the first plate portion 36 is bent, a space can be secured besides the first plate portion 36 adjacent to the one end portion 32. Consequently, the space efficiency of the housing portion 22 of the case 20 can be increased.

The bent portion 35 corresponds to a coupling portion.

Second Embodiment

Figure 9:
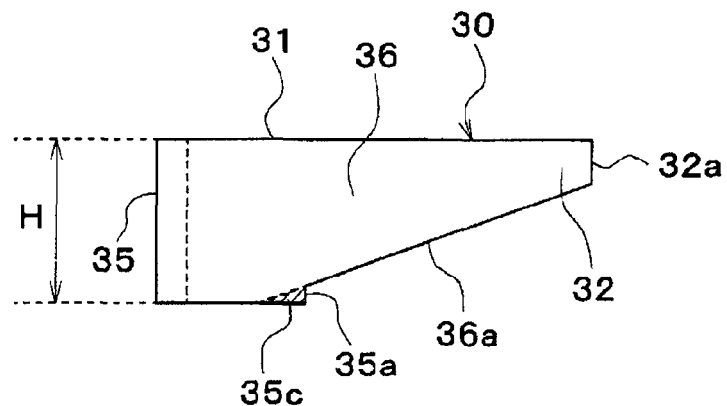
FIG. 9 is a lateral view of a core according to a second embodiment.
Figure 10:
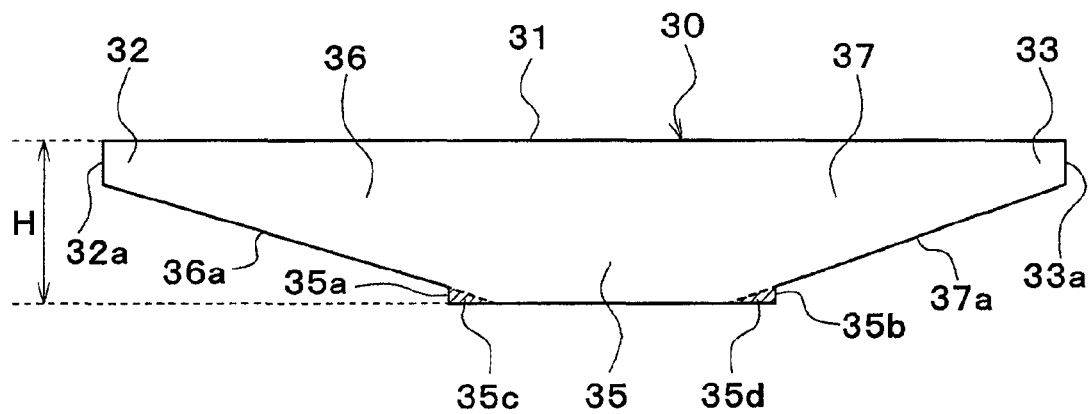
FIG. 10 is a development view of the core shown in FIG. 9.

In this embodiment, portions different from the first embodiment will be described. As shown in a lateral view of FIG. 9 and a development view of FIG. 10, when using a roll material having the width of H as a plate member 31, a core 30 may have a first angled portion 35c and a second angled portion 35d in order to restrict burr when stamping. In FIG. 9 and FIG. 10, the angled portions 35c and 35d are shown by diagonal hatching.

Specifically, the width of a bent portion 35 in a width direction perpendicular to the longitudinal direction of the plate member 31 is greater than the width of a part of a first plate portion 36 connected to the bent portion 35. When the first tapered portion 36a is virtually extended to the interior of the bent portion 35, a portion of the bent portion 35 cut off by the first tapered portion 36a inside the bent portion 35 corresponds to the first angled portion 35c. In other words, of an end 35a of the bent portion 35, an angled portion of the first plate portion 36 adjacent to the first tapered portion 36a is the first angled portion 35c.

Regarding the second angled portion 35d, in the same way as the first angled portion 35c, when the second tapered portion 37a is virtually extended to the interior of the bent portion 35, a portion of the bent portion 35 cut off by the second tapered portion 37a inside the bent portion 35 forms the second angled portion 35d. In other words, of an other end 35b of the bent portion 35, an angled portion of the second plate portion 37 adjacent to the second tapered portion 37a is the second angled portion 35d.

Thus, burr generated when stamping can be restricted by the angled portions 35c and 35d provided in the core 30.

When the first angled portion 35c is provided in the bent portion 35, the first tapered portion 36a is formed so that the width of the first plate portion 36 of the plate member 31 continuously decreases from the end 35a of the bent portion 35 to a distal end 32a of one end portion 32. In the same way, when the second angled portion 35d is provided in the bent portion 35, the second tapered portion 37a is formed so that the width of the second plate portion 37 of the plate member 31 continuously decreases from the end 35b of the bent portion 35 to a distal end 33a of the other end portion 33. Also, the angled portions 35c and 35d do not affect the magnetic characteristics of the core 30.

Third Embodiment

Figure 11:
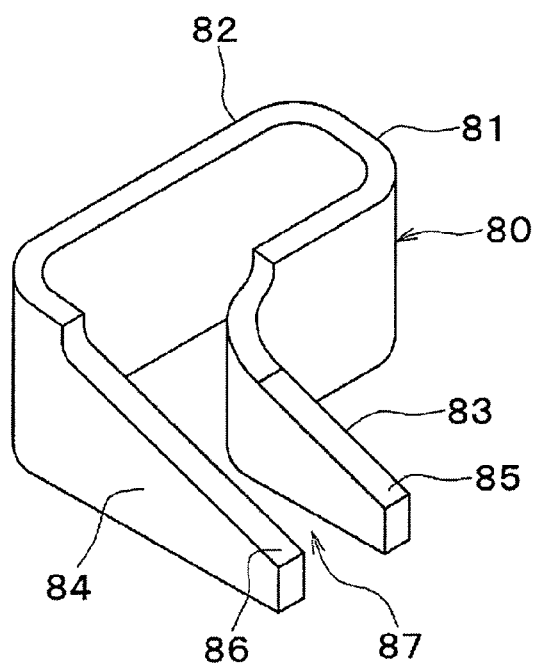
FIG. 11 is a perspective view of a core according to a third embodiment.

In this embodiment, portions different from the first and second embodiments will be described. As shown in FIG. 11, a core 80 according to this embodiment is configured of a coupling portion 82, a fifth plate portion 83 and a sixth plate portion 84. One plate member 81 is bent at multiple locations in the coupling portion 82. Each of the fifth plate portion 83 and the sixth plate portion 84 is a part of the plate member 81, and is connected to the coupling portion 35. That is, when the core 80 is developed, the plate member 81 is configured as a member in which the coupling portion 82 is interposed between the fifth plate portion 83 and the sixth plate portion 84.

One end portion 85 of the plate member 81 corresponds to an end portion of the fifth plate portion 83 on the side opposite to the coupling portion 82. Another end portion 86 of the plate member 81 corresponds to an end portion of the sixth plate portion 84 on the side opposite to the coupling portion 82. The one end portion 85 and the other end portion 86 of the plate member 81 are disposed to oppose to each other across a constant magnetic gap 87.

Figure 12:
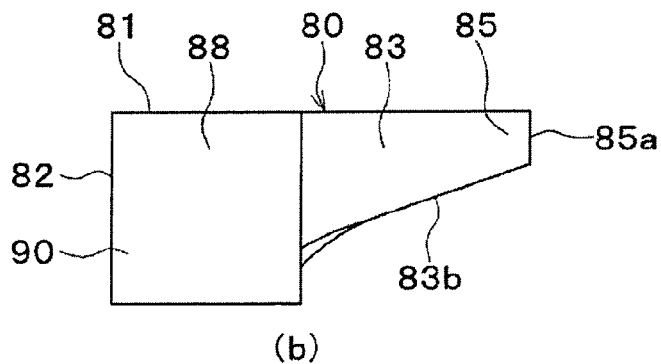
FIG. 12 (a) is a plan view of the core of FIG. 11 on each tapered portion side, FIG. 12 (b) is a lateral view of the core of FIG. 11 on a first plate portion side, FIG. 12 (c) is a lateral view of the core of FIG. 11 on a second plate portion side, and FIG. 12 (d) is a front view of the core of FIG. 11 on a magnetic gap side.
Figure 12:
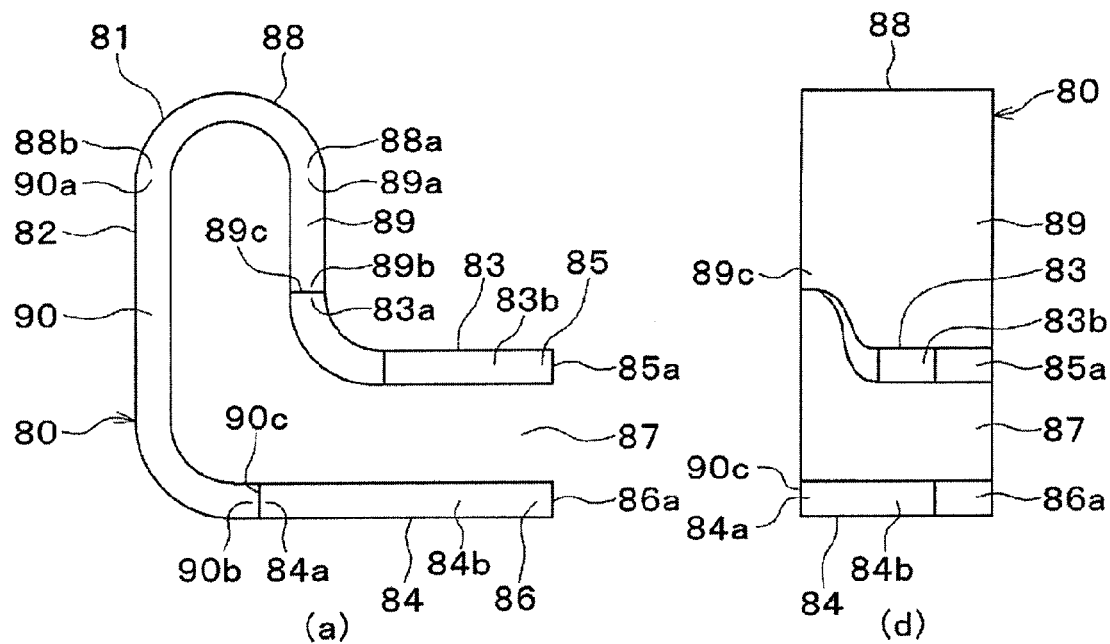
Figure 12:
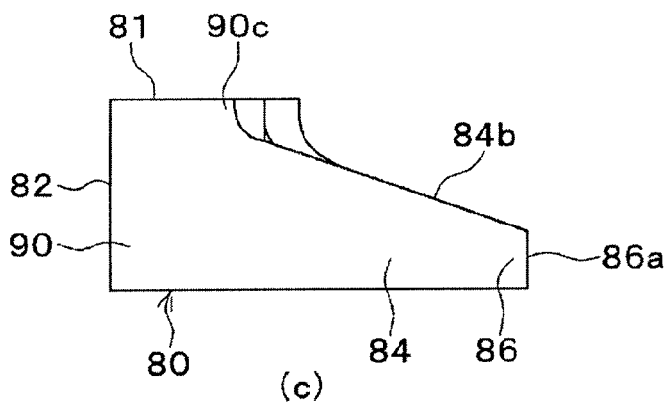

As shown in FIG. 12 (a), the coupling portion 82 is configured to include a bent portion 88, a first connection portion 89, and a second connection portion 90. The width of the coupling portion 82 is constant. In the same way as the bent portion 35, the bent portion 88 is bent with a constant diameter to have a half cylinder form.

The first connection portion 89 is a plate-form portion connecting the bent portion 88 and the fifth plate portion 83. One end 89a of the first connection portion 89 is connected to one end 88a of the bent portion 88, while an other end 89b of the first connection portion 89 is connected to one end 83a of the fifth plate portion 83. Further, the first connection portion 89 is connected to the end 88a of the bent portion 88 adjacent to the one end portion 85 in the tangential direction of the end 88a of the bent portion 88 adjacent to the one end portion 85. With this configuration, magnetic flux caught in the bent portion 88 can be efficiently led to the first connection portion 89.

The first connection portion 89 has a first angled portion 89c provided adjacent to the other end 89b. The first angled portion 89c is defined in a manner that the width of the first connection portion 89 adjacent to the other end 89b is greater than the maximum width of the one end portion 83a of the fifth plate portion 83.

The second connection portion 90 is a plate-form portion connecting the bent portion 88 and the sixth plate portion 84. One end 90a of the second connection portion 90 is connected to an other end 88b of the bent portion 88, while an other end 90b of the second connection portion 90 is connected to one end 84a of the sixth plate portion 84. Further, the second connection portion 90 is connected to the end 88b of the bent portion 88 adjacent to the other end portion 86 in the tangential direction of the end 88b of the bent portion 88 adjacent to the other end portion 86. With this configuration, magnetic flux caught in the bent portion 88 can be efficiently led to the second connection portion 90.

The second connection portion 90 has a second angled portion 90c provided adjacent to the other end 90b. In the same way as the first angled portion 89c, the second angled portion 90c is defined in a manner that the width of the second connection portion 90 adjacent to the other end 90b is greater than the maximum width of the one end portion 84a of the sixth plate portion 84.

The first angled portion 89c and the second angled portion 90c restrict burr when stamping the plate member 81.

As shown in FIG. 12 (a) and FIG. 12 (b), the fifth plate portion 83 has a third tapered portion 83b. The third tapered portion 83b is a portion formed so that the width of the fifth plate portion 83 continuously decreases from the one end 83a of the fifth plate portion 83 to a distal end 85a of the one end portion 85. Even when the first angled portion 89c is provided in the first connection portion 89, the third tapered portion 83b is formed so that the width of the fifth plate portion 83 continuously decreases from the end portion 89b of the first angled portion 89c to the distal end 85a of the one end portion 85.

As shown in FIG. 12 (c), the sixth plate portion 84 has a fourth tapered portion 84b. The fourth tapered portion 84b is a portion formed so that the width of the sixth plate portion 84 continuously decreases from the one end 84a of the sixth plate portion 84 to a distal end 86a of the other end portion 86. Even when the second angled portion 90c is provided in the second connection portion 90, the fourth tapered portion 84b is formed so that the width of the sixth plate portion 84 continuously decreases from the end portion 90b of the second angled portion 90c to the distal end 86a of the other end portion 86.

In the core 80, the other end portion 90b of the second connection portion 90 and the one end portion 83a of the fifth plate portion 83 are bent so that the one end portion 85 of the fifth plate portion 83 forms the magnetic gap 87 with the other end portion 86 of the sixth plate portion 84. With this configuration, a hollow portion of the core 80 forms an L-shape, as shown in FIG. 12 (a). Also, as the whole of the core 80 forms an L-shape, the space efficiency of the core 80 can be increased. In the same way as in the first embodiment, a further increase in space efficiency is possible by bending an intermediate portion of the fifth plate portion 83.

The second connection portion 90 and the fifth plate portion 83 are bent so that the distance between inner wall surfaces of the bent portion 88 at the end portions 88a and 88b in the core 80, that is, the inner diameter (diameter) of the bent portion 88, is greater than the magnetic gap 87. The second connection portion 90 and the fifth plate portion 83 are bent to have a rounded form that is not an inflection portion. With this configuration, the magnetic resistance of the core 80 can be reduced.

Further, a side surface of the coupling portion 82 on the side opposite to the third tapered portion 83b and the fourth tapered portion 84b, a side surface of the fifth plate portion 83 on the side opposite to the third tapered portion 83b, and a side surface of the sixth plate portion 84 on the side opposite to the fourth tapered portion 84b, are positioned in the same plane, in the plate member 81.

As shown in FIG. 12 (d), the width of the core 80 is increased by the shape of the core 80. Therefore, a thick bus bar, or the like, can be a target of measurement. Also, the accuracy of processing the bent portion of the core 80 can be increased by adopting the sixth plate portion 84 as a processing reference.

The bent portion 88, the first connection portion 89, and the second connection portion 90 correspond to a coupling portion. The third tapered portion 83b corresponds to a first tapered portion. The fourth tapered portion 84b corresponds to a second tapered portion.

Other Embodiments

The present disclosure is not limited to the current sensor 10 shown in each of the embodiments, and another configuration may be adopted. For example, the bent portion 35 of the core 30 is not limited to have the half cylinder form. The bent portion 35 may be bent to have, for example, an arc form, within a range that does not affect the magnetic resistance characteristics of the core 30.

In each embodiment, the core 30, 80 is configured of one plate member 31, 81. The core 30, 80 may be configured of multiple plate members 31, 81. For example, the core 30, 80 may be formed by two stamped plate members 31, 81 being stacked and bent. When multiple plate members 31, 81 are stacked in this way, a magnetic flux path can be effectively produced by the skin effect of the plate member 31, 81. In particular, when the measured current is alternating current, the skin effect increases, such that there is an advantage to configuring the core 30, 80 of the multiple plate members 31, 81.

In the third embodiment, the first angled portion 89c is provided in the first connection portion 89, and the second angled portion 90c is provided in the second connection portion 90. However, this is one configuration example. The first angled portion 89c and the second angled portion 90c need not necessarily be provided in the core 80. In this case, the width of the first connection portion 89 adjacent to the other end portion 89b and the maximum width of the one end portion 83a of the fifth plate portion 83 are the same. In the same way, the width of the second connection portion 90 adjacent to the other end portion 90b and the maximum width of the one end portion 84a of the sixth plate portion 84 are the same.

Figure 13:
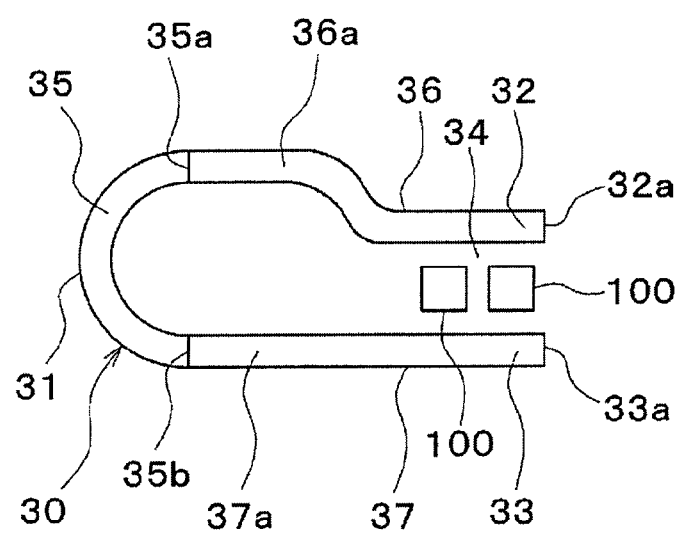
FIG. 13 is a plan view for describing another embodiment.

As shown in FIG. 13, two of the Hall IC 100 may be disposed in the magnetic gap 34 of the core 30. In this case, the two of the Hall IC 100 are arranged to be parallel to a part of the core 30 configuring the magnetic gap 34, that is, to be parallel to the first plate portion 36 and the second plate portion 37 configuring the magnetic gap 34. With this configuration, current to be measured can be measured in two ranges. In the same way, in case where two of the Hall IC 100 are disposed in the magnetic gap 87 of the core 80 shown in the third embodiment, the two of the Hall IC 100 are arranged to be parallel to the fifth plate portion 83 and the sixth plate portion 84 configuring the magnetic gap 87.

The invention claimed is:

1. An electric current sensor comprising:
  a core having a coupling portion formed by bending a part of a plate member, one end portion and the other end portion of the plate member being disposed to oppose to each other through a constant magnetic gap on a side opposite from the coupling portion,
  when a current to be measured flows to pass through a hollow portion of the core, the electric current sensor is configured to detect a magnitude of the current based on a magnitude of a magnetic flux generated in the core, wherein
  the core has
    a first tapered portion in which a width of the plate member continuously decreases from one end of the coupling portion adjacent to the one end portion to a distal end of the one end portion, and
    a second tapered portion in which the width of the plate member continuously decreases from an other end of the coupling portion adjacent to the other end portion to a distal end of the other end portion, and
    the width of the plate member is constant in the coupling portion from the one end adjacent to the one end portion to the other end adjacent to the other end portion.

2. The electric current sensor according to claim 1, wherein the coupling portion is configured as a bent portion bent with a constant diameter to have a half cylinder form.

3. The electric current sensor according to claim 2, wherein,
  the plate member has a first plate portion defined from the one end of the bent portion adjacent to the one end portion to the distal end of the one end portion and a second plate portion defined from the other end of the bent portion adjacent to the other end portion to the distal end of the other end portion,
  the first plate portion is connected to the one end adjacent to the one end portion along a tangential direction of the one end of the bent portion adjacent to the one end portion, and
  the second plate portion is connected to the other end adjacent to the other end portion along a tangential direction of the other end of the bent portion adjacent to the other end portion.

4. The electric current sensor according to claim 2, wherein a distance between an inner wall surface of the bent portion at the one end adjacent to the one end portion and an inner wall surface of the bent portion at the other end adjacent to the other end portion is greater than the magnetic gap.

5. The electric current sensor according to claim 1, wherein
  the coupling portion has
    a bent portion bent with a constant diameter to have a half cylinder form,
    a first connection portion connected to one end of the bent portion adjacent to the one end portion, and
    a second connection portion connected to an other end of the bent portion adjacent to the other end portion.

6. The electric current sensor according to claim 5, wherein
  the first connection portion is connected to the one end adjacent to the one end portion along a tangential direction of the one end of the bent portion adjacent to the one end portion, and
  the second connection portion is connected to the other end adjacent to the other end portion along a tangential direction of the other end of the bent portion adjacent to the other end portion.

7. The electric current sensor according to claim 5, wherein a distance between an inner wall surface of the bent portion at the one end adjacent to the one end portion and an inner wall surface of the bent portion at the other end adjacent to the other end portion is greater than the magnetic gap.

8. The electric current sensor according to claim 1, wherein a first angled portion is defined between the coupling portion and the first tapered portion, and a second angled portion is defined between the coupling portion and the second tapered portion.

9. The electric current sensor according to claim 1, wherein
  the plate member has
    a first plate portion defined from the one end of the bent portion adjacent to the one end portion to the distal end of the one end portion,
    a second plate portion defined from the other end of the bent portion adjacent to the other end portion to the distal end of the other end portion, and
    the coupling portion coupling the first plate portion and the second plate portion with each other,
  the first plate portion, the second plate portion, and the coupling portion have a same thickness to configure the plate member, and
  the first plate portion and the second plate portion extend straightly in parallel with each other.

10. The electric current sensor according to claim 1, wherein at least one of the first tapered portion and the second tapered portion includes a sigmoidal curve.

11. An electric current sensor comprising:
a core having a coupling portion formed by bending a part of a plate member, one end portion and the other end portion of the plate member being disposed to oppose to each other through a constant magnetic gap on a side opposite from the coupling portion,
when a current to be measured flows to pass through a hollow portion of the core, the electric current sensor is configured to detect a magnitude of the current based on a magnitude of a magnetic flux generated in the core, wherein
the core has
a first tapered portion in which a width of the plate member continuously decreases from one end of the coupling portion adjacent to the one end portion to a distal end of the one end portion, and
a second tapered portion in which the width of the plate member continuously decreases from an other end of the coupling portion adjacent to the other end portion to a distal end of the other end portion,
the width of the plate member is constant in the coupling portion from the one end adjacent to the one end portion to the other end adjacent to the other end portion,
the coupling portion is configured as a bent portion bent with a constant diameter to have a half cylinder form defined by dividing a cylinder into two along a central axis so as to pass through the central axis of the cylinder,
the one end of the coupling portion adjacent to the one end portion corresponds to a starting point of the first tapered portion,
the other end of the coupling portion adjacent to the other end portion corresponds to a starting point of the second tapered portion,
the plate member has a first plate portion defined from the one end of the bent portion adjacent to the one end portion to the distal end of the one end portion and a second plate portion defined from the other end of the bent portion adjacent to the other end portion to the distal end of the other end portion, and
a side surface of the coupling portion opposite to the first tapered portion and the second tapered portion, a side surface of the first plate portion opposite to the first tapered portion, and a side surface of the second plate portion opposite to the second tapered portion are positioned in the same plane.

12. The electric current sensor according to claim 11, wherein
the width of the plate member is continuously linearly reduced at a fixed change ratio in the first tapered portion, and
the width of the plate member is continuously linearly reduced at a fixed change ratio in the second tapered portion.

13. The electric current sensor according to claim 11, wherein
the first plate portion is connected to the one end adjacent to the one end portion along a tangential direction of the one end of the bent portion adjacent to the one end portion, and
the second plate portion is connected to the other end adjacent to the other end portion along a tangential direction of the other end of the bent portion adjacent to the other end portion.

14. The electric current sensor according to claim 11, wherein a distance between an inner wall surface of the bent portion at the one end adjacent to the one end portion and an inner wall surface of the bent portion at the other end adjacent to the other end portion is greater than the magnetic gap.

15. The electric current sensor according to claim 11, wherein at least one of the first tapered portion and the second tapered portion includes a sigmoidal curve.

* * * * *